(12) United States Patent
Blondin et al.

(10) Patent No.: US 8,933,710 B2
(45) Date of Patent: Jan. 13, 2015

(54) INTEGRATED CIRCUIT FOR CAPACITIVE MEASUREMENT INCLUDING A FLOATING BRIDGE

(75) Inventors: Christophe Blondin, Nîmes (FR); Christian Neel, Nîmes (FR); Didier Roziere, Nîmes (FR)

(73) Assignee: Nanotec Solution, Nimes (FR)

( * ) Notice: Subject to any disclaimer, the term of this patent is extended or adjusted under 35 U.S.C. 154(b) by 0 days.

(21) Appl. No.: 14/126,698

(22) PCT Filed: Jun. 8, 2012

(86) PCT No.: PCT/FR2012/051290
§ 371 (c)(1),
(2), (4) Date: Dec. 16, 2013

(87) PCT Pub. No.: WO2012/172241
PCT Pub. Date: Dec. 20, 2012

(65) Prior Publication Data
US 2014/0125357 A1    May 8, 2014

(30) Foreign Application Priority Data
Jun. 16, 2011 (FR) .................................. 11 55288

(51) Int. Cl.
*G01R 27/26* (2006.01)
*G01D 5/24* (2006.01)
*G06F 3/044* (2006.01)

(52) U.S. Cl.
CPC .............. *G01R 27/2605* (2013.01); *G01D 5/24* (2013.01); *G06F 3/044* (2013.01)

USPC .......................................... 324/658; 324/688

(58) Field of Classification Search
USPC .................................... 324/658, 688
See application file for complete search history.

(56) References Cited

U.S. PATENT DOCUMENTS 8,149,002 B2    4/2012   Ossart
2008/0231292 A1*  9/2008   Ossart et al. ................. 324/688

FOREIGN PATENT DOCUMENTS

| FR | 2756048 | 5/1998 |
|---|---|---|
| FR | 2893711 | 5/2007 |
| WO | 2608751 | 6/1988 |
| WO | 2007/060324 | 5/2007 |

* cited by examiner

*Primary Examiner* — Vincent Q Nguyen
(74) *Attorney, Agent, or Firm* — Greer, Burns & Crain, Ltd.

(57) ABSTRACT

A capacitive measurement device is provided, including: (i) a first electronic system electrically referenced to a guard potential and connectable to capacitive electrodes; (ii) a second electronic system electrically referenced to a ground potential; and (iii) an energizing component connected to the guard and ground potentials, respectively, to impart an AC voltage differential between the potentials. The device also includes an integrated circuit that is referenced to the ground and includes a first installation area in which the first electronic system is implemented, and a second installation area in which the second electronic system is implemented. Also included are systems using the device and uses of the device.

19 Claims, 4 Drawing Sheets

INTEGRATED CIRCUIT FOR CAPACITIVE MEASUREMENT INCLUDING A FLOATING BRIDGE

TECHNICAL FIELD

The present invention relates to an electronic device for capacitive measurement including a floating bridge which can be produced in the form of an integrated circuit.

The field of the invention is more particularly but not limitatively that of electronic devices for measurement and detection.

BACKGROUND

The touch or contactless interfaces of portable systems such as telephones, smartphones, tablets, computers, etc. are frequently based on capacitive measurement techniques.

According to these techniques, the screen or the device is provided with electrodes, which are optionally transparent. When an object such as a finger comes close to these electrodes, an electrical coupling of capacitive type is created between this object which represents an electrical ground, and the electrodes. Measurement of this capacitive coupling thus allows the object to be located.

The progress towards contactless interfaces for which objects must be detected and located at relatively long distances from the surface of the interface requires the development of capacitive detection systems with very high sensitivity.

The capacitive "floating bridge" measurement technique, developed initially for very high accuracy measurement applications, proves to be particularly well adapted to this type of application.

This technique is for example described in the document FR 2 756 048 by Rozière. It makes it possible to eliminate all the parasitic capacitances which appear in more conventional capacitive measurement methods between the electrodes and their environment. To the extent that these parasitic capacitances, by definition unknown and fluctuating, are superimposed on the capacitance to be measured between an object and the electrodes, they significantly limit the sensitivity and the accuracy of measurement by conventional methods.

To this end, a part of the electronics, comprising the detection electrodes and the first stages of the measurement electronics which are the most sensitive, are made to float. Their reference electrical potential, or guard potential, is made to oscillate with respect to the general ground of the system for example using an oscillator which connects the ground and the guard. Thus, no part of the electronics of the sensitive stages is at the ground and it cannot create parasitic capacitances with the ground.

In order to be able to implement a capacitive measurement technique in a portable device such as a telephone or a tablet, it is imperative to be able to produce the associated electronics in the form of an integrated circuit of small overall dimensions and low power consumption.

It is known to produce measurement systems such as those disclosed in FR 2 756 048 in the form of printed or hybrid circuits with discrete components. On the other hand, the embodiments described in FR 2 756 048 cannot be produced in the form of a single integrated circuit.

One problem originates from the fact that the electronics comprise two distinct parts, with distinct reference potentials and oscillating with respect to one another. This generates the following constraints:

the two parts should not cause mutual interference, and in particular the grounded elements should not interfere with the floating elements;

the transfer of signals between the floating and grounded parts require decoupling components such as choke coils or optical couplers which cannot be integrated;

the electrical supplies of the floating part must be generated or transferred from grounded supply sources, which again requires decoupling components (choke coils, DC/DC converters) which are difficult to integrate.

The document FR 2 893 711 by Rozière is known, which discloses a device for capacitive measurement by floating bridge based on an integrated circuit. However, in this case it is the whole of the integrated circuit that is supplied in floating mode, or in other terms at the guard potential. It is therefore necessary to add external components in order to produce the interfacing with the electronics referenced to ground, which is therefore also external to the measurement integrated circuit. Moreover, at least a part of the printed circuit on which it is fixed must also be referenced to the guard potential.

More generally, when capacitive electronics are implemented with a guard serving to minimize or eliminate parasitic capacitances, it is necessary to separate the guard area from the remainder of the electronics which is capable of generating stray capacitances. In all cases this constraint poses integration difficulties.

The purpose of the present invention is to propose an electronic device for capacitive measurement including a guard, which can be produced in the form of a single integrated circuit referenced to ground, so as to be able to be easily inserted onto a conventional electronic circuit.

SUMMARY

This objective is achieved with a capacitive measurement device comprising:

a first electronic system, electrically referenced to a guard potential, and capable of being connected to capacitive electrodes, a second electronic system, electrically referenced to a ground potential, and connected to said first electronic system by connecting means, and excitation means connected respectively to said guard and ground potentials so as to impose an AC voltage difference between these potentials, characterized in that it comprises moreover an integrated circuit, referenced to the ground, comprising:

a first installation area, referenced to the guard potential and in which said first electronic system is implemented, and a second installation area, referenced to the ground potential, and in which said second electronic system is implemented.

The term "connected" must of course be interpreted in the sense that components connected to each other can be connected directly, through a direct electrical link, or connected via additional electrical or electronic components.

The definition of the guard and ground potentials is of course non limitative, the ground potential could also be floating or variable with respect to another reference such as the earth.

The ground potential can for example correspond to the reference potential of the electronics to which the device according to the invention is connected, and/or the reference potential of a voltage source supplying the integrated circuit.

According to an advantageous aspect of the invention, the part referenced to the guard potential of the device according to the invention can be essentially contained in the integrated circuit, which is itself referenced and supplied by voltage sources referenced to the ground potential. Thus, its integration into an electronic system in general is greatly facilitated, and the constraints linked to the presence of the electronic part referenced to the guard potential are minimized.

The device according to the invention can moreover comprise:
- a shielding surface electrically connected to the guard potential, and arranged so as to cover the surface of the first installation area at least partially and at least along one side;
- a shielding surface electrically connected to the guard potential, and arranged so as to cover the surface of the first and second installation areas at least partially and at least along one side.

The shielding surface can be inside the package of the integrated circuit. It can be produced at the level of the substrate of the component(s) implementing the electronic functions (chips) contained in the package of the integrated circuit. It can also be outside the package of the integrated circuit and be produced at the level of the printed circuit onto which this package is soldered.

This shielding surface is an important element for the proper functioning of the integrated circuit. In fact, the first electronic system referenced to the guard potential, or at least its most sensitive parts, must be protected from disturbances such as parasitic capacitances which can form with the elements referenced to the ground potential (which is also the target potential that the capacitive electrodes must detect). For this reason, in the devices of the prior art, the part referenced to the guard potential is always produced in the form of distinct components separate from the components referenced to the ground.

Conversely, it has been recognised within the scope of the invention that the fact of shielding the integrated circuit with a shield referenced to the guard potential effectively protects the first electronic system referenced to the guard from the disturbances in its surroundings, and does not significantly disturb the second electronic system referenced to the ground, which essentially comprises not very sensitive digital components.

According to embodiments, the integrated circuit can comprise:
- two distinct chips respectively comprising the first and second installation areas, integrated in the same package, or
- a chip comprising the first and second installation areas on the same substrate.

The integrated circuit can comprise at least one chip produced by implementing at least one of the following technologies: CMOS, silicon on insulator (SOI).

SOI (silicon on insulator) technology makes it possible to produce electrical isolation between parts of a circuit for example at different reference potentials, using electrically insulating layers of silicon oxide.

Within the scope of CMOS technology, electrical isolation can only be obtained using depletion layers created between parts of the P-doped substrate and parts of the N-doped substrate, polarized in the reverse direction (which has the effect of blocking the P-N junction). Thus, the implementation of the invention using this technology, which is moreover common and of relatively moderate cost, poses particular constraints and requires finding an architecture allowing a distribution of the floating and non-floating electrical potentials compatible with the isolation constraints.

The chip can be produced by implementing a multiple-well CMOS technology.

The chip can in particular be produced by implementing a triple-well CMOS technology, comprising:
- a P-doped substrate, connected to the guard potential,
- a first N-doped well,
- two N- and P-doped wells included in the first well, and each corresponding to one of the first and second installation areas.

The integrated circuit can be produced by implementing at least one of the following technologies:
- assembling one or more juxtaposed chips in a package,
- 3D stacking of chips ("chip level packaging"),
- direct connections of chips ("flip chip").

The 3D stacking of the chips corresponds for example to the techniques called "chip level packaging" in which the chips are superimposed or stacked. They can then be connected for example by through connections ("TSV, through Silicon Via").

In the "flip chip" direct connections technique, the chips or sets of chips are placed directly on the printed circuit, or soldered directly thereto, for example using matrices of bumps.

The integrated circuit can comprise moreover (i) first connection elements making it possible to connect the first electronic system to the capacitive electrodes and/or to the elements at the guard potential, (ii) second connection elements making it possible on the one hand to connect the second electronic system to external processing electronics, and on the other hand to supply said second electronic system, which first and second connection elements being separated by at least one connection element connected at the guard potential.

Generally, the internal connections to the integrated circuit, and the external connections between this integrated circuit and the outside, must be arranged so as to avoid capacitive couplings between sensitive elements of the part referenced to the guard potential and elements referenced to the ground potential. In order to do this, the connections to the guard potential can be suitably intercalated, and the arrangement and the geometry of the connections optimized.

The fact that the parts referenced respectively to the guard potential and to the ground potential are incorporated essentially into a single integrated circuit is an advantage of the invention, as it allows an optimization of the couplings during the design of the integrated circuit, independently of the environment of its subsequent use.

The integrated circuit can comprise moreover means for generating at least one supply referenced to the guard potential.

Therefore, it is not necessary to generate a supply referenced to the guard potential outside the integrated circuit, and the part at the guard potential of the electronics can be essentially limited to the integrated circuit.

The transfer of a DC supply source between the part at the ground potential and the part at the guard potential poses a particular problem as it requires connecting means operating at low frequencies, such as inductances, which are very disadvantageous in terms of space requirement.

According to embodiments, the integrated circuit can comprise moreover:
- an AC supply voltage source referenced to the ground potential, the circuit of which is closed via the excitation means, and
- rectifying and filtering means, connected at their input respectively to said AC supply voltage source and to the guard potential, so as to generate at the output a supply voltage referenced to said guard potential by rectification of a voltage at the terminals of the AC supply voltage source.

Thus an AC supply voltage source referenced to the ground potential is used, therefore on the side where the power is available.

The electrical circuit of the AC supply voltage source is closed via excitation means, or in other words the current of this source flows through these excitation means.

The circuit of the AC supply voltage source, which is used for generating a supply voltage and therefore a power referenced to the reference potential, can thus be closed between the guard potential and the ground potential, without additional connection means, and without short-circuiting the two reference potentials.

This configuration is possible as the excitation means, whatever their configuration, behave substantially as a perfect voltage generator, also called a Thevenin generator. This generator imposes an AC voltage difference between the ground and guard potentials, which makes it possible to keep them floating with respect to each other, while presenting a very low impedance for the supply current. This result could not be obtained without the presence of excitation means.

The rectifying and filtering means can be designed so as to only comprise components that can be integrated, such as capacitors and passive switching means (diodes, etc.) or active switching means ("switches" or switches based on transistors, etc.).

They can be produced in any compatible form, such as for example according to a single rectifier principle with a diode, or a Schenkel voltage-doubling rectifier.

According to embodiments, the excitation means of the device according to the invention can comprise moreover one of the following sets of components:

a voltage follower buffer, referenced to the ground potential and energized by an oscillator referenced to the guard potential.

an oscillator referenced to the ground potential.

In both cases, the power to the excitation means is provided by supplies referenced to the ground potential. The implementation of the buffer makes it possible to have available an oscillator referenced to the guard potential, with low consumption and equally usable for excitation and/or synchronization in the first electronic system during the capacitive measurements.

According to embodiments, the connecting means can comprise capacitors in series.

In fact, in order to transfer digital or analogue signals between the parts at different reference potentials, it is necessary to provide decoupling means, according to a technology which is very suitable for implementation in the form of an integrated circuit. In the devices of the prior art such as for example those described in FR 2 893 711, use is often made of inductances, which cannot be integrated.

According to embodiments, the first electronic system can comprise scanning means making it possible to sequentially poll the capacitive electrodes in order to measure the capacitance.

A large number of electrodes can thus be measured with a single data acquisition system.

The device according to the invention can comprise moreover means of communication with similar devices, allowing it to operate in master or slave mode, according to which:

the excitation means of a device configured in master mode imposes a similar AC voltage difference between the guard and ground potentials of devices configured in slave mode, and the excitation means of devices configured in slave mode are at least partially deactivated.

It is thus possible by using several identical or similar integrated circuits configured in master-slave mode (or synchronized) to address a larger number of electrodes than what can be achieved with a single integrated circuit. Moreover, the electrodes are all referenced to the same guard potential, which is essential for the quality of the measurements.

According to another aspect, a system of detection and/or of measurement of the position of objects is proposed comprising a plurality of capacitive electrodes and at least one capacitive measurement device according to the invention.

When several capacitive measurement devices are implemented, they can be configured in master-slave mode.

The system can comprise transparent electrodes arranged on a display screen.

A device according to the invention can be implemented or used in all types of capacitive measurement applications.

According to yet another aspect, a use of at least one device according to the invention is proposed in any one of the following applications:

human-machine touch and/or contactless interface, dimensional measurement system, anti-collision system, proximity detector.

A device according to the invention can thus for example be used for producing a compact capacitive measurement system, or for driving an antenna for the capacitive detection of the position of a patient in a medical imaging system.

BRIEF DESCRIPTION OF THE DRAWINGS

Other advantages and characteristics of the invention will become apparent on examination of the detailed description of an embodiment which is in no way limitative, and the attached diagrams, in which.

DETAILED DESCRIPTION

Figure 1:
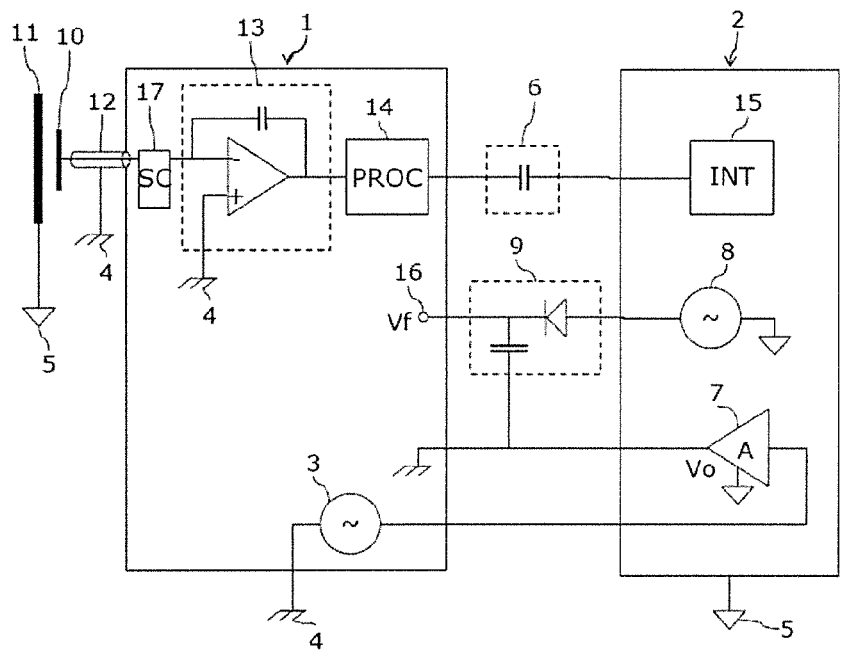
FIG. 1 shows a general electrical diagram of a capacitive measurement device according to the invention.

With reference to FIG. 1, firstly a general electrical diagram of a capacitive measurement device according to the invention will be described.

The capacitive measurement device according to the invention is based on a floating bridge configuration as described in the document FR 2 756 048. FIG. 1 is a very diagrammatic illustration thereof, it being understood that the different measurement configurations described in FR 2 756 048 are applicable within the scope of the invention.

Such a capacitive measurement system makes it possible to measure an item of capacitance information between at least one measuring electrode 10 and a target 11 at a potential connected to the ground potential 5.

The electronics comprise a first electronic acquisition system 1 referenced to a guard potential 4 oscillating with respect to the ground potential 5, and a second electronic processing (or transfer) system 2 referenced to the ground potential 5. Of course, the designations of the electronic systems are chosen for clarity of the disclosure, without any limitative effect. The electronic acquisition system 1 can in particular comprise signal processing means, including digital. The electronic processing system 2 can be limited to interface functions 15 with the remainder of the electronics.

The device comprises moreover excitation means 3, 7 connected respectively to the guard 4 and ground 5 potentials. These excitation means perform the function of imposing an AC voltage difference, between these potentials 4, 5 thus causing the "floating" of one of the reference potentials with respect to the other.

In FR 2 756 048, these excitation means essentially comprise an oscillator 3, referenced to the guard potential 4, and comprising an outlet connected to the ground potential 5.

From the point of view of generating the excitation voltage, the oscillator 3 can be equally well referenced to the guard potential 4 or to the ground potential 5. However, insofar as it is also used for generating an excitation signal on the electrodes 10 in particular, it must preferably be referenced to the guard potential 4.

The oscillator 3 as implemented in FR 2 756 048 must consume a non negligible amount of electrical power in order to maintain the AC potential difference between the reference potentials 4, 5. Now, as explained previously, the electrical power is more easily available on the side referenced to the ground potential 5.

For this reason, in the device according to the invention the excitation means are distributed differently. They comprise an oscillator 3 referenced to the guard potential 4. This oscillator generates an AC signal which can be used as an excitation or clock signal in the electronic acquisition system 1. This signal can be of any shape (for example sinusoidal, square, or triangular) depending on the applications.

The device according to the invention also comprises a buffer 7 referenced to the ground potential 5. This buffer 7 comprises an amplifier or a voltage follower (with unity gain) produced on the basis of transistors arranged in the form of operational amplifier(s). The output of the oscillator 3 is connected to the input of the buffer 7. The output of the buffer 7 is connected to the guard potential 4.

The buffer 7 delivers an excitation signal Vo at the output. As its internal electrical reference (or that of its supply) is the ground potential 5, it acts as a voltage source delivering a signal Vo or in other words generating an AC voltage difference Vo between the ground 5 and the guard potential 4.

By operating in this way, the advantages of an oscillator 3 referenced to the guard potential 4 are obtained, but the electrical consumption of which is minimized, as most of the power necessary to energize the guard potential 4 is provided by the buffer 7 which is referenced, and thus supplied, by the part at the ground potential 5.

The electronic acquisition system 1 is entirely referenced to the guard potential 4 so as to avoid the appearance of parasitic capacitances between the measuring electrodes 10 or other sensitive parts and the ground potential 5, to which the target or the detected object 11 is connected. Similarly, guard electrodes 12 protect the measuring electrodes 10. Being at the same potential as the latter, they also avoid the appearance of parasitic capacitances.

The measuring electrodes 10 are connected to a charge amplifier 13 which makes it possible to measure the capacitance thereof. FIG. 1 shows a very diagrammatic representation of the charge amplifier 13, which can be produced in all forms, including those described in FR 2 756 048. The charge amplifier 13 can in particular be produced in the form of a closed loop system, using the oscillator signal 3 the amplitude of which can be modulated, in order to measure a capacitance or an inverse capacitance by a null method.

According to the applications, the electronic acquisition system 1 can comprise signal processing stages 14, in order for example to deliver a signal representative of a distance between the measuring electrodes 10 and the target 11.

The system is in general designed to "read" a plurality of electrodes 10 of all geometries. It therefore comprises a scanner 17 inserted between the electrodes 10 and the charge amplifier 13, and making it possible to measure the capacitance of these electrodes 10 sequentially. This scanner 17 can take the form of a series of analogue switches referenced to the guard potential 4, and controlled by an electronic control unit.

The device according to the invention makes it possible in particular to produce touch or contactless interfaces for devices such as mobile phones (smartphones), tablets or computers. The electrodes 10 can be transparent electrodes, for example made of ITO (tin-doped indium oxide), deposited on a display screen or a touch pad. They are then used to detect the approach and/or the contact of a command object 11 such as a finger.

The device according to the invention also comprises an electronic processing system 2 electrically referenced to a ground potential 5. This electronic processing system 2 also ensures the interface function between the device according to the invention and the remainder of the electronics (except of course the electrodes 10). This makes it possible to produce a device according to the invention essentially in the form of an integrated circuit which is globally referenced to the ground potential 5, and supplied by supply sources referenced to the ground potential 5.

The electronic processing system 2 is connected to the electronic acquisition system 1 by connecting means 6 which make it possible to send digital or analogue signals. These connecting means 6 comprise electrical connections provided with decoupling means so as to ensure isolation between the ground and guard potentials, at least within a frequency range. Within the scope of the invention capacitors are preferably used as decoupling means, as they can be easily integrated and allow the transfer of signals at least at high frequencies (for example digital).

The device according to the invention can be synchronized with other devices according to the invention or other compatible devices in order to control a larger number of electrodes 10 than would be feasible with a single device.

In order to do this, the devices are configured respectively according to a master or slave mode, for example using internal logic functions, so as to:
  connect the guard potentials 4 of all the devices,
  deactivate the oscillator 3 and the buffer 7 of the devices configured in slave mode,
  transmit the output of the oscillator 3 and of the output of the buffer 7 of a device configured in master mode to the devices configured in slave mode.

According to a variant, if the gains of the buffers 7 of the different devices are sufficiently homogeneous, the following configuration can be used:

deactivate the oscillator 3 of the devices configured in slave mode, transmit the output of the oscillator 3 of a device configured in master mode to the devices configured in slave mode, and use its buffer 7 for each slave device.

With the aim of producing a device according to the invention essentially in the form of an integrated circuit which is globally referenced to the ground potential 5, it is necessary to also generate, in this device, supplies referenced to the guard potential 4. Moreover, these supplies must be produced with components which can be easily integrated.

In the embodiment shown in FIG. 1, the device according to the invention therefore comprises at least one supply source Vf referenced to the guard potential 4, which comprises an AC supply voltage source 8 referenced to the ground potential 5, and rectifying and filtering means 9.

The rectifying and filtering means 9 are connected at their input respectively to the AC supply voltage source 8 and to the guard potential 4. They comprise, according to the example of implementation in FIG. 1 which is in no way limitative, a rectifying diode connected to the AC supply voltage source 8 and a filtering capacitor in parallel on the output 16 of the supply Vf referenced to the guard potential 4. This filtering capacitor can also be an equivalent capacitor, due to an input impedance of a component.

For such a circuit diagram to operate, the current must have a return path to the AC supply voltage source 8. In the device according to the invention, this return path is provided through of the output of the buffer 7.

The buffer 7 controlled by the oscillator 3 in fact allows a return path for the supply circuit via a connection between the guard potential 4 and the ground potential 5, without short-circuiting these reference potentials at the excitation signal frequencies of the oscillator 3. This effect is obtained as explained previously thanks to the Thevenin generator operation of the buffer 7 controlled by the oscillator 3, which imposes the excitation signal between the guard 4 and ground 5 potentials, whilst having a low impedance.

The supply source Vf can in particular be used to supply the oscillator 3, and, for example, the charge amplifier 13.

Figure 2:
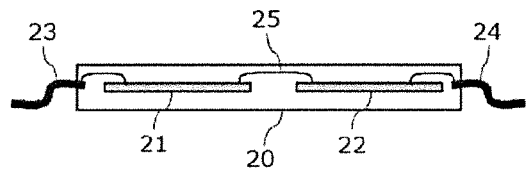
FIG. 2 shows an embodiment of a capacitive measurement device in the form of an integrated circuit comprising two separate chips in the same package.

With reference to FIG. 2, according to a first embodiment, the device according to the invention comprises an integrated circuit 20 which itself comprises two distinct chips 21, 22 integrated in the same package.

The integrated circuit 20 is, without loss of generality, of SMT (Surface-Mount Technology) type, with pins 23, 24 capable of being soldered onto a printed circuit.

The electronic acquisition system 1 referenced to the guard potential 4 is implemented in the form of a first installation area, or acquisition area 38 in a first chip 21, and the electronic processing system 2 referenced to the ground potential 5 is implemented in the form of a second installation area, or processing area 39 in a second chip 22.

The advantage of this embodiment is to considerably simplify the production of the chips 21, 22, which each comprise only a single reference potential.

The chips 21, 22 are connected by internal connecting wires 25 according to standard "bonding" techniques.

The chip 21, referenced to the guard potential 4, is connected to the measuring electrodes 10 and to the other elements referenced to the guard by a first set of pins 23 of the integrated circuit 20.

The chip 22, referenced to the ground potential 5, is connected to the other elements of the electronics by a second set of pins 24 of the integrated circuit 20.

The pins 23, 24 and the internal connecting wires 25 are arranged so that the connections with the sensitive parts referenced to the guard potential 4, and in particular the connections with the electrodes 10, are only surrounded by connections referenced to the guard 4.

Figure 3:
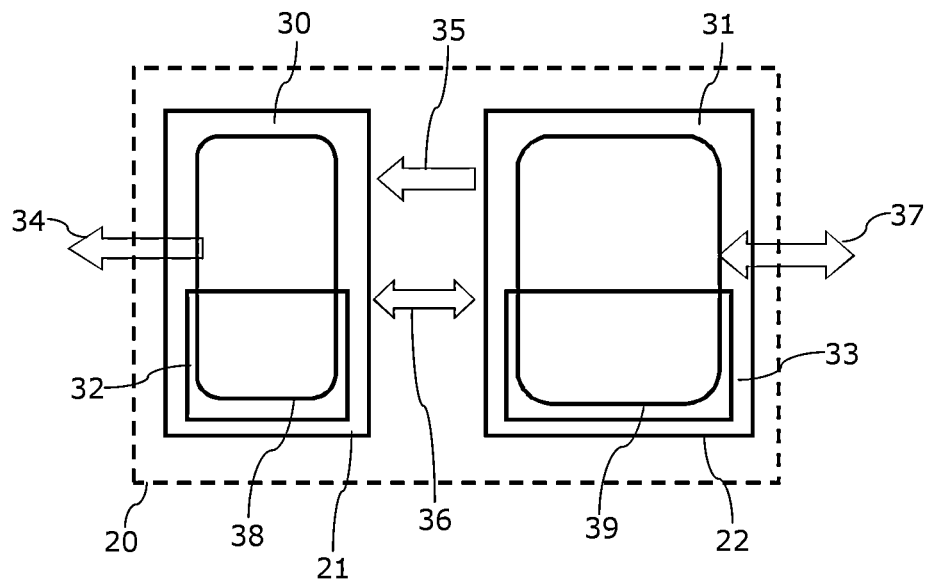
FIG. 3 shows an internal arrangement of a capacitive measurement device produced in the form of an integrated circuit comprising two separate chips in the same package.

FIG. 3 shows an example of installation of the embodiment with separate chips 21, 22 in the form of ASICs (Application-Specific Integrated Circuits) produced with CMOS technology.

The chip 21 comprises in particular two supply planes 30, 32, the substrate 30 of which, referenced or connected to the guard potential 4, and an acquisition area 38 in which the electronic acquisition system 1 is implemented.

The chip 22 comprises in particular two supply planes 31, 33, including the substrate 31, referenced or connected to the ground potential 5, and a processing area 39 in which the electronic processing system 2 is implemented.

The connections 29 between the chips 21, 22 include the supply transfers 35 to the acquisition area 38 and the data transfers 36 between the acquisition 35 and processing 39 areas.

According to a variant, the chip 22 comprising the electronic processing system 2 can be produced with an FPGA (Field-Programmable Gate Array) logic circuit.

Figure 4:
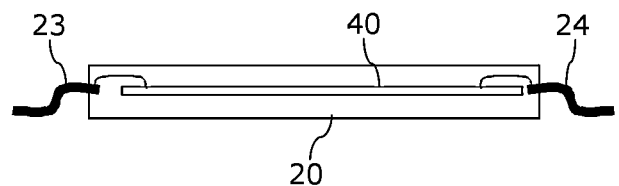
FIG. 4 shows an embodiment of a capacitive measurement device in the form of an integrated circuit comprising a single chip.

With reference to FIG. 4, according to a second embodiment, the device according to the invention comprises an integrated circuit 20 which comprises a single chip 40.

The integrated circuit 20 is, without loss of generality, of SMT (Surface-Mount Technology) type, with pins 23, 24 capable of being soldered onto a printed circuit.

The pins 23, 24 are arranged so that the connections to sensitive parts referenced to the guard potential 4, and in particular the connections to the electrodes 10, are surrounded only by connections referenced to the guard 4.

Figure 5:
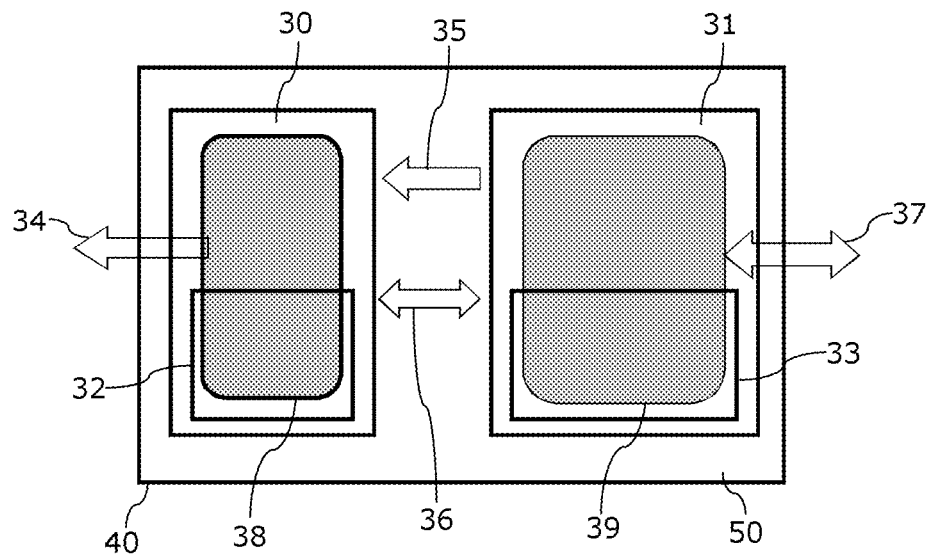
FIG. 5 shows an internal arrangement of a capacitive measurement device produced in the form of an integrated circuit comprising a single chip.

FIG. 5 shows an example of the installation of this embodiment of the chip 40 in the form of an integrated circuit or an ASIC (Application-Specific Integrated Circuit) produced with CMOS technology.

The acquisition areas 38 referenced to the guard potential 4, and the processing areas 39 referenced to the ground potential 5, are produced in the same chip 40.

The substrate 50 of the chip 40 is connected to the guard potential. This configuration has the advantage of generating a guard plane which covers all of the acquisition areas 38 and reference area 39, and allows a significant reduction in the sensitivity to parasitic capacitances.

The acquisition area 38 is surrounded by supply planes 30, 32, referenced to or connected to the guard potential 4.

The processing area 39 is surrounded by supply planes 31, 33, referenced or connected to the ground potential 5.

The supply transfers 35 to the acquisition area 38 and the data transfers 36 between the acquisition 35 and processing 39 areas are produced on the chip 40.

Figure 6:
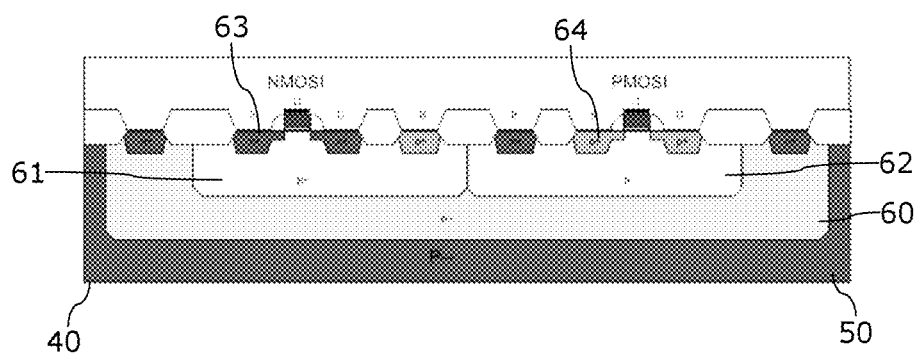
FIG. 6 shows an embodiment example of a device according to the invention in a CMOS technology.

With reference to FIG. 6, the chip 40 is produced with CMOS technology according to a three-well technique. It comprises:

a first P-doped well 50, corresponding to the substrate 50, which is connected at the guard potential 4.

a second N-doped well 60, a third P-doped well 61 and a third N-doped well 62, included in the second well 60 and comprising the components 63, 64 of the acquisition 38 and reference 39 areas.

The electrical isolation necessary for the correct operation of the assembly can be obtained under reverse polarization of the P-N junctions in order to block them. In order to do this, the particular relationships between the reference voltages 4, 5 and supply voltages of the different parts must be respected.

Figure 7:
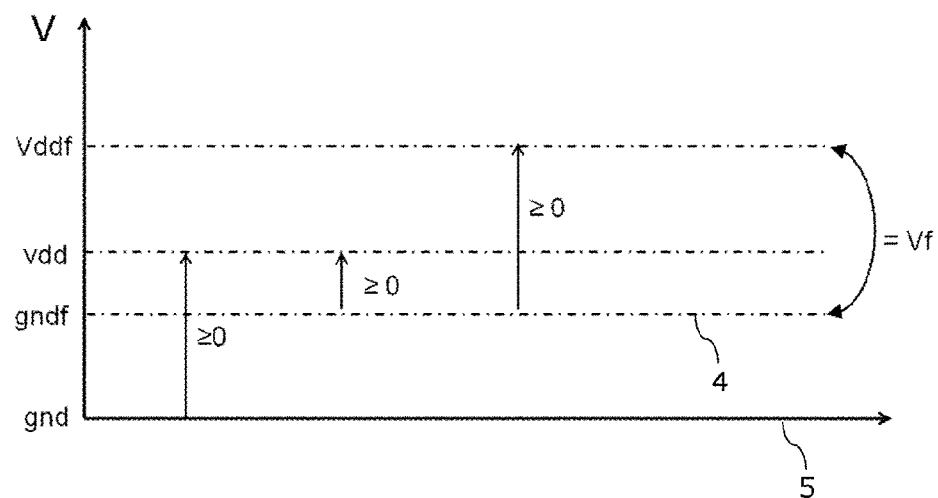
FIG. 7 shows a distribution of the electrical potential levels in the embodiment example of a device according to the invention in a CMOS technology.

FIG. 7 shows the voltage levels to be taken into account.

The following are defined: gnd the ground reference potential 5; vdd the voltage level of the supply referenced to the ground 5; gndf the guard reference potential 4; and vddf the voltage level of the supply referenced to the guard potential 4.

According to FIG. 7, the following conditions are imposed:
(i) vdd≥gnd,
(ii) vdd≥gndf at any moment as gndf is a potential oscillating relative to vdd,
(iii) vddf≥gndf, knowing that vddf−gndf=Vf, a supply voltage referenced to the guard potential 4;

On the basis of these conditions, the potentials of the wells can be distributed as follows:

P-doped substrate 50 at the potential gndf, i.e. at the guard potential 4, second N-doped well 60 and third N-doped well 62 at the potential vddg, with the transistors 64 of the well 62 at the potential gnd, which makes it possible to have the junctions blocked by default, third P-doped well 61 at the potential gndf, with the transistors 63 of the well 61 at the potential vddf, which makes it possible to have the junctions blocked by default.

In this configuration, the acquisition area 38 referenced to the guard potential 4 is implemented in the well 61, and the processing area 39 referenced to the ground potential 5 is implemented in the well 62.

The potentials can also be distributed in the following way, which is substantially equivalent:

P-doped substrate 50 at the potential gndf, i.e. at the guard potential 4, second N-doped well 60 and third N-doped well 62 at the potential vddf, with the transistors 64 of the well 62 at the potential gndf, which makes it possible to have the junctions blocked by default, third P-doped well 61 at the potential gnd, with the transistors 63 of the well 61 at the potential vdd, which makes it possible to have the junctions blocked by default.

In this configuration, the acquisition area 38 referenced to the guard potential 4 is implemented in the well 62, and the processing area 39 referenced to the ground potential 5 is implemented in the well 61.

Figure 8:
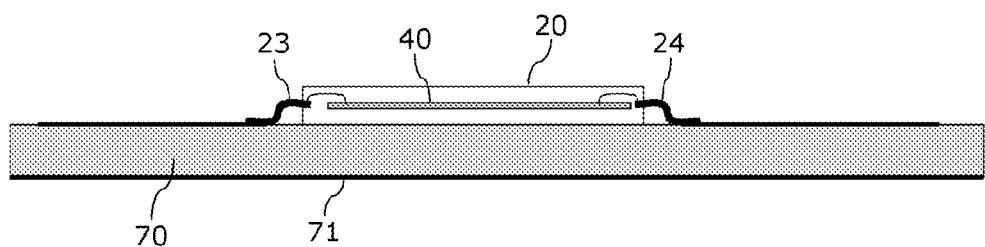
FIG. 8 shows the installation of a device according to the invention produced in the form of an integrated circuit.

With reference to FIG. 8, the device according to the invention can advantageously be completed by a shielding plane 71 at the guard potential 4 placed for example on the face opposite to the printed circuit 70 on which the integrated circuit is soldered.

According to variants,
the integrated circuit 20 can comprise all types of cases, including for example a package with side connections with pins 23, 24 arranged on the sides, or a package with matrix connections with pins arranged in a matrix under the package;
the chips 21, 22 or 40 can be connected to the package by wires, or by balls of solder ("ball bounded"),
the integrated circuit 20 can be produced according to "flip chip" techniques, according to which the chips are directly connected to the printed circuit, without an intermediate package,
the chips 20, 21 can be assembled by 3D assembly techniques ("chip level packaging").

Of course, the invention is not limited to the examples which have just been described and numerous adjustments can be made to these examples without exceeding the scope of the invention.

The invention claimed is:

1. A capacitive measurement device comprising:
   a first electronic system, electrically referenced to a guard potential, and capable of being connected to capacitive electrodes;
   a second electronic system, electrically referenced to a ground potential, and connected to said first electronic system by connecting means; and
   excitation means connected respectively to said guard and ground potentials so as to impose an AC voltage difference between these potentials;
   an integrated circuit, referenced to the ground, including:
      a first installation area, referenced to the guard potential and in which said first electronic system is implemented; and
      a second installation area, referenced to the ground potential, and in which said second electronic system is implemented.

2. The device according to claim 1, further comprising a shielding surface electrically connected to the guard potential, and arranged so as to cover the surface of the first installation area at least partially and at least along one side.

3. The device according to claim 1, further comprising a shielding surface electrically connected to the guard potential, and arranged so as to cover the surface of the first and second installation areas at least partially and at least along one side.

4. The device according to claim 1, wherein the integrated circuit comprises two distinct chips comprising respectively the first and second installation areas, integrated in the same package.

5. The device according to claim 1, wherein the integrated circuit comprises a chip comprising the first and second installation areas on the same substrate.

6. The device according to claim 5, wherein the chip is produced by implementing a multiple-well CMOS technology.

7. The device according to claim 6, wherein the chip is produced by implementing a triple-well CMOS technology, and comprises:
   a P-doped substrate, connected to the guard potential;
   a first N-doped well; and
   two N- and P-doped wells included in the first well, and each corresponding to one of the first and second installation areas.

8. The device according to claim 1, wherein integrated circuit comprises at least one chip produced by implementing at least one of the following technologies: CMOS, silicon on insulator (SOD).

9. The device according to claim 1, wherein the integrated circuit is produced by implementing at least one of the following technologies:
   assembling one or more juxtaposed chips in a package;
   3D stacking of chips ("chip level packaging"); and
   direct connections of chips ("flip chip").

10. The device according to claim 1, wherein the integrated circuit comprises moreover (i) first connection elements making it possible to connect the first electronic system to capacitive electrodes and/or to elements at the guard potential; (ii) second connection elements making it possible on the one hand to connect the second electronic system to external processing electronics, and on the other hand to supply said second electronic system; said first and second connection elements being separated by at least one connection element connected to the guard potential.

11. The device according to claim 1, wherein the integrated circuit comprises moreover means for generating at least a supply referenced to the guard potential.

12. The device according to claim 11, wherein the integrated circuit further comprises:
    an AC supply voltage source referenced to the ground potential, the circuit of which closes through excitation means; and
    rectifying and filtering means, connected at their input respectively to said AC supply voltage source and to the guard potential (4), so as to generate at an outlet a supply voltage referenced to said guard potential by rectification of a voltage at the terminals of the AC supply voltage source.

13. The device according to claim 1, wherein said excitation means further comprises one of the following sets of components:
    a voltage follower buffer, referenced to the ground potential, said buffer being energized by an oscillator referenced to the guard potential; and
    an oscillator referenced to the ground potential.

14. The device according to claim 1, wherein the connecting means comprise capacitors in series.

15. The device according to claim 1, wherein the first electronic system comprises scanning means making it possible to poll the capacitive electrodes sequentially in order to measure the capacitance thereof.

16. The device according to claim 1, further comprising means of communication with similar devices, allowing it to operate in a master or slave mode, according to which:
    the excitation means of a device configured in master mode imposes a similar AC voltage difference between the guard and ground potentials of devices configured in slave mode; and
    the excitation means of devices configured in slave mode are at least partially deactivated.

17. A system for the detection and/or measurement of the position of objects, comprising a plurality of capacitive electrodes and at least one capacitive measurement device according to claim 1.

18. The system according to claim 17, further comprising transparent electrodes arranged on a display screen.

19. Use of at least one device according to claim 1 in any one of the following applications:
    a human-machine touch and/or contactless interface;
    a dimensional measurement system;
    an anti-collision system; and
    a proximity detector.

* * * * *